United States Patent [19]

Ker et al.

[11] Patent Number: 5,140,401
[45] Date of Patent: Aug. 18, 1992

[54] CMOS ESD PROTECTION CIRCUIT WITH PARASITIC SCR STRUCTURES

[75] Inventors: Ming D. Ker, Hsinchu; Chung Y. Lee, Chung-Li; Chung Y. Wu, Hsinchu; Joe Ko, Hsin-chu, all of Taiwan

[73] Assignee: United Microelectronics Corporation, Hsinchu, Taiwan

[21] Appl. No.: 674,666

[22] Filed: Mar. 25, 1991

[51] Int. Cl.[5] ............................................. H01L 27/02
[52] U.S. Cl. ................................................... 357/43
[58] Field of Search ..................................... 357/41, 43

[56] References Cited

U.S. PATENT DOCUMENTS 4,937,647  6/1990  Sutton ............................ 357/43

Primary Examiner—John D. Lee
Assistant Examiner—Robert E. Wise
Attorney, Agent, or Firm—Goerge O. Saile

[57] ABSTRACT

A circuit for protecting a CMOS device against excessive voltages has two SCR circuits in which the bipolar transistors are formed as parasitic devices. One SCR circuit is connected between a line to be protected and one power supply point and the other SCR circuit is connected between the line to be protected and the other power supply point. The power supply points form sinks for currents associated with excessive voltages, and they form reference potential points for establishing the voltage at which an SCR turns on. A semiconductor device having an n-substrate has three p-wells. The center p-well (as seen in section) forms part of two vertical transistors, one for each of the two SCR's. Each outer p-well cooperates with the center p-well and the intervening substrate to form a lateral transistor for one of the SCR's. These transistors use shared semiconductor regions that establish the base to collector interconnections of an SCR. These regions and other structures also form an FET and a diode in each SCR circuit that turn on the SCR in response to an excessive voltage.

17 Claims, 2 Drawing Sheets

CMOS ESD PROTECTION CIRCUIT WITH PARASITIC SCR STRUCTURES

FIELD OF THE INVENTION

This invention relates to a circuit for protecting other components from excessive voltages. The invention also relates to a semiconductor device that embodies the protection circuit and also carries the components that are to be protected.

BACKGROUND OF THE INVENTION

1. Introduction

This invention relates to the familiar problem of protecting components such as field effect transistors (FET's) from excessive voltages that may be caused, for example, by an electrostatic discharge (ESD). Protection circuits are important for CMOS devices because as their dimensions are made smaller, they become more susceptible to damage by ESD.

This protection circuit uses a silicon controlled rectifier (SCR), and it will be helpful to review the features and terminology of SCRs that particularly apply to this invention. An SCR can be represented in a circuit diagram as an NPN bipolar junction transistor and a PNP bipolar junction transistor that are interconnected so that each receives base current from collector terminal of the other. When either transistor is turned on, it supplies base current to the other. Thus the circuit latches with both transistors turned on after either of the transistors is initially turned on. The two transistors turn off when the current is interrupted in either transistor.

2. The Prior Art

Chatterjee and Polgreen have discussed the advantages of an SCR as a protection device in a paper in the IEEE 1990 *Symposium on VLSI Technology*, pages 75-76, entitled "A Low-Voltage Triggering SCR for ON-Chip ESD Protection at Output and Input Pads". FIG. 2 shows the structure of an integrated circuit device with an SCR and an FET for triggering the SCR at a low voltage.

Rountree, IEDM Tech Dig pp 580-583 "ESD Protection for Submicron CMOS Circuits Issues and Solutions" has also discussed protection circuits using SCR's.

Avery U.S. Pat. No. 4,484,244 teaches a protection circuit having two SCR's connected to a protected line. One SCR (Q1, Q2) conducts excessive positive voltages to ground and the other (Q3, Q4) conducts excessive negative voltages to ground.

Avery U.S. Pat. No. 4,595,941 show an FET connected to turn on an SCR in response to an excessive voltage.

SUMMARY OF THE INVENTION

One object of this invention is to provide an ESD protection circuit that uses dual SCRs to take advantage of the ability of the SCR to sink more ESD energy more quickly than other active devices that have been used in other ESD protection circuits (MOSFET's and bipolar junction transistors). These SCR structures do not stay latch-up after the ESD transitions and normal circuit operation can resume.

Another object of this invention is to produce these bipolar SCR's using only a CMOS process and without increasing the number of processing steps. The SCR structures are parasitic bipolar devices. Parasitic PMOS and NMOS FET's used in the protection circuit are formed using field-oxide.

This ESD protection circuit has a parasitic vertical bipolar junction transistor and a parasitic lateral bipolar junction transistor that are formed by the CMOS process that is used for CMOS components on the device. These transistors share semiconductor regions that interconnect the base and collector to form the SCR. The circuit also has a parasitic field-oxide PMOS FET or a parasitic field-oxide NMOS FET to help quickly turn on this SCR structure during either positive or negative ESD transitions. The circuits can be implemented in an n-type substrate with p-well process or in a p-type substrate with n-well process with symmetrical changes in the layouts. The circuit can be formed in a small area, about 100 microns on a side.

THE DRAWING

THE PREFERRED EMBODIMENT

Figure 1:
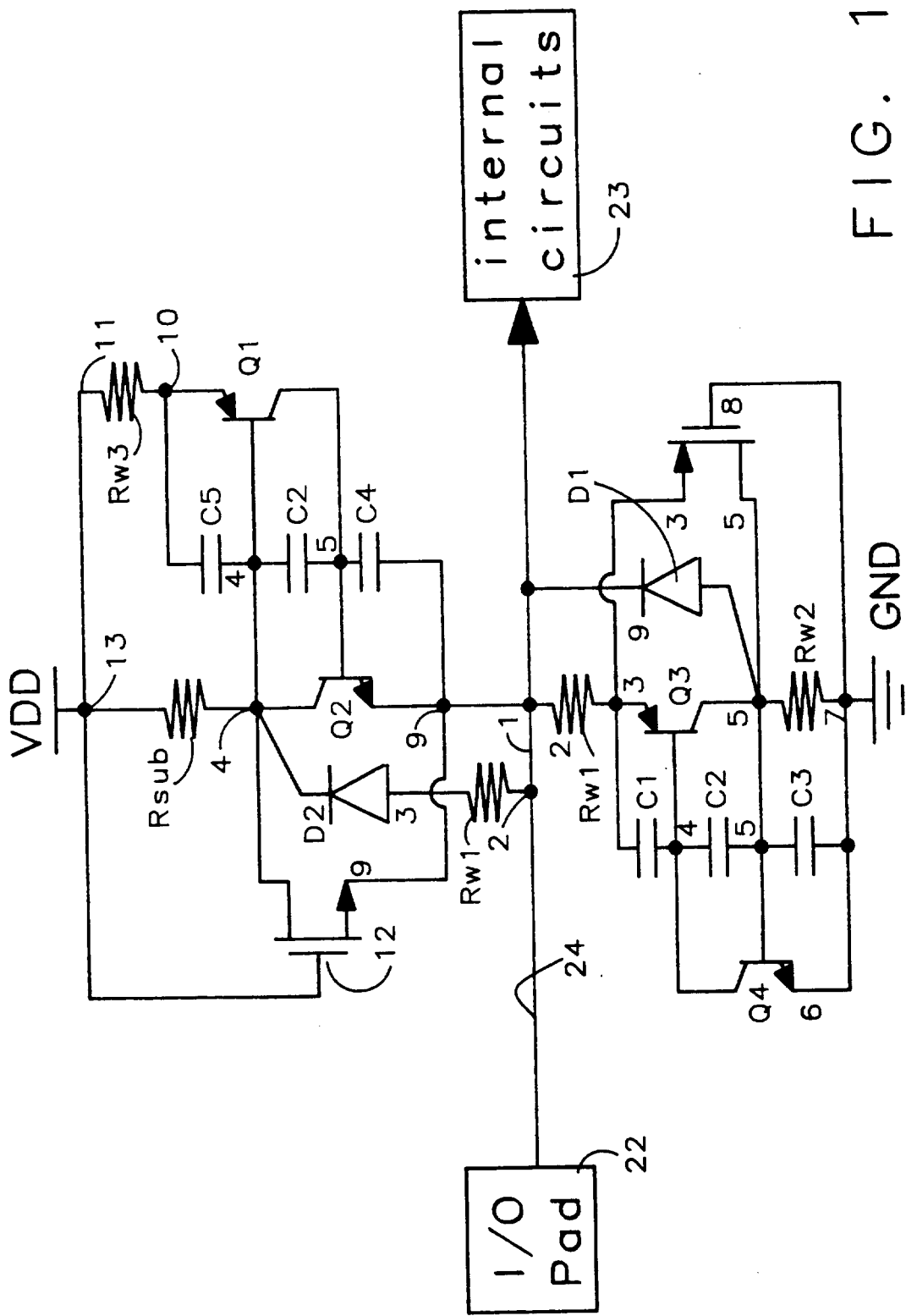
FIG. 1 is a schematic drawing of the ESD protection circuit of this invention.
Figure 2:
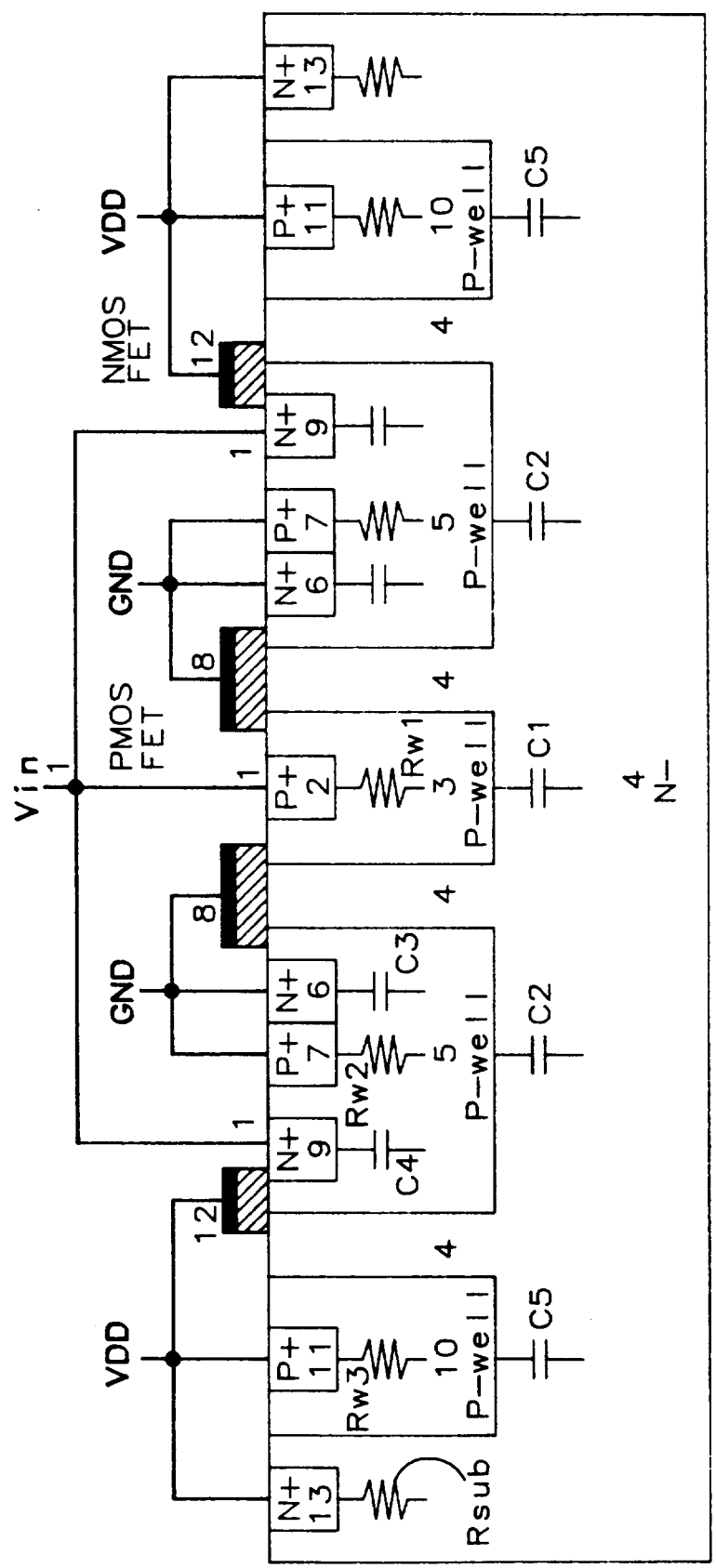
FIG. 2 is a cross-section view of a device that implements the circuit of FIG. 1.

In some instances, reference characters used with nodes in the description of the circuit of FIG. 1 also identify the corresponding components or semiconductor regions in the structure shown in FIG. 2. Some of these reference characters appear more than once in FIG. 1 at points that are electrically equivalent in the circuit and have related structures in FIG. 2. The SCR circuits will be described as discrete NPN and PNP bipolar junction transistors whereas in the actual structure shown in FIG. 2 some components are formed by common semiconductor structures. The structure will be described as an N-substrate with P-wells, which FIG. 2 shows. The corresponding structure with a P-substrate and N-wells will be described later.

THE CIRCUIT OF FIG. 1

The Circuit to be Protected

An I/0 pad 22 is connected to internal circuits 23 by a line 24 (1 in FIG. 2). An excessive voltage can occur at pad 22 from an electrostatic discharge or other cause, and the circuit and device of this invention limit the voltage on line 24 to protect circuits 23. Circuits 23 are shown as a functional block because protective circuits are useful in a variety of applications.

Note that FIG. 1 is organized so that line 24 divides the circuit schematic horizontally. One SCR circuit and the associated positive power supply terminal $V_{DD}$ are located above line 24, and the other SCR circuit and the other power supply terminal GND are located below line 24. It will be convenient to call these circuits the upper SCR circuit and the lower SCR circuit. (There is of course no structural significance to this terminology, and the terminology applies to circuit devices in which $V_{DD}$ is either positive with respect to ground.)

The Upper SCR Circuit

Bipolar transistors Q1 and Q2 have their collector and base terminals interconnected to form an SCR. The SCR conducts in the direction shown by the arrows at the emitter terminals, and the transistors are turned on when the line to be protected receives an excessive voltage of negative polarity. Other components of the upper SCR circuit will be described as they appear in the following description of operations that turn on transistors Q1 and Q2.

As is well known, an SCR can turn on in response to a voltage across the two emitter terminals. Capacitors C2, C4, and C5 are the inherent capacitances that appear in the structure that will be described later. When a negative ESD voltage appears on line 24 with a high rate of change (dV/dt), Q1 and Q2 are turned on by the displacement current of the capacitors. (Capacitor C2 bypasses the high impedance of the base-collector junctions.)

When a negative ESD voltage has a low rate of change, transistor Q2 turns on first. Its collector current flows through Rsub from $V_{DD}$, and the voltage drop across Rsub turns on Q1 and thereby triggers the SCR to the on-state.

The NMOS FET

An NMOS FET is connected to conduct in its source-drain circuit between node 4 and the line to be protected, and it turns on the SCR when it conducts. Considered from a different standpoint, it conducts in parallel with the collector-emitter circuit of transistor Q2 and thereby turns on transistor Q1 in the same way that Q1 is otherwise turned on by the conduction of Q2. The gate of this FET is connected to $V_{DD}$, which provides a reference voltage, and the source terminal is connected to line 24. Since the FET turns on in response to a suitable voltage across its source and gate terminals, it turns on when the voltage on the line to be protected reaches a predetermined negative value. When the FET turns on, it produces a voltage across resistor Rsub which turns on Q1 to begin the latching action. In the structure that will be described later, the turn-on voltage of the NMOS is about 30–50 volts.

The Diode Circuit

A diode D2 and a resistor Rw1 are connected between the line to be protected and node 4. (This is substantially the same as the connection of the FET.) At a predetermined voltage across these nodes, the diode conducts in its reverse direction, and the diode current turns on Q1.

Note that when the line to be protected becomes sufficiently positive with respect to $V_{DD}$, the diode conducts in its forward direction in series with resistors Rw1 and Rsub. Q1 under this condition is off. Q2 turns on in its reverse-mode operation.

The Lower SCR Circuit

In the lower SCR circuit, two bipolar transistors, Q3 and Q4, form an SCR. From a circuit standpoint, Q3 corresponds to Q2 and Q4 corresponds to Q1, and their operation will be understood from the description of the upper SCR circuit. From a structure standpoint, Q1 and Q3, which are both PNP transistors, have related structures in FIG. 2; Q2 and Q4 are both NPN transistors and have related structures in FIG. 2.

The Structure of FIG. 2

Note that the structure is symmetrical about a vertical line. Each half of the structure forms both an upper SCR circuit and a lower SCR circuit. The two symmetrical structures are located on opposite sides of the line to be protected, as is conventional with other protection circuits, and alternatively it can be arranged in other ways, for example with only half of the structure of FIG. 2.

The Lateral Transistor Q1

Q1 is a parasitic lateral PNP bipolar junction transistor which has an emitter formed by a p-well 10 (node 10 in FIG. 1), a collector formed by another p-well 5, and a base formed by the intervening N-substrate 4. The length of the vertical current path in p-well 10 provides the resistance of resistor Rw3. The junction of p-well 10 and the n-substrate establishes capacitor C5.

The distance separating the two p-wells 5, 10 can be selected to control the gain of Q1. (The beta gain is made larger when the distance is made smaller.) The beta gain can be made to be larger than 1. (A suitable gain is required in for the SCR latching operation.)

The Vertical Transistor Q2

Q2 is a parasitic vertical NPN bipolar junction transistor having a base formed by the p-well 5, a collector formed by the underlying n-substrate 4 and an emitter formed by an N+ diffusion 9 in the p-well 5. The junction of N+ diffusion 9 and p-well 5 establishes capacitor C4.

In the normal CMOS process used to fabricate digital IC devices or analog IC devices, the depth of an N+ diffusion is fixed and the depth of a p-well is also fixed. Consequently, the width of base (and the associated beta gain) in the vertical transistor Q2 are substantially fixed. However, the beta gain of Q2 can be as high as 100–200 in normal CMOS processes, and the object of avoiding changes in normal IC fabrications processes can be achieved.

Note that p-well 5 forms both the collector of transistor Q1 and the base of transistor Q2 and thereby provides the connection that is represented in FIG. 1 by a conductive line. Similarly, the n-substrate 4 forms both the collector of transistor Q2 and the base of transistor Q1 and provides their interconnection. The junction of p-well 5 and n-substrate 4 establishes capacitor C2.

When an excessive negative voltage appears at line Vin, its circuit path to terminal $V_{DD}$ can be traced through the following structures: Vin node to N+ diffusion 9 (the emitter of Q2), p-well 5 (the emitter of Q2), substrate 4 (the collector of Q2 and the resistor Rsub), p-well 10, P+ diffusion 11 and $V_{DD}$.

The Parasitic Field-Oxide NMOS

The field-oxide NMOS FET has a drain formed by the n-substrate 4, a source formed by the N+ diffusion 9, and a channel formed by the intervening p-well 5.

Field oxide is used for the gate insulation, and a metal layer on the top of the field oxide forms the gate electrode 12 connected to $V_{DD}$ as gate. As stated earlier, the turn-on voltage (between gate and source) of each NMOS is in the range of 30–50 volts.

Diode D2

The anode of the diode is formed by a p-well 3 and the cathode is formed by the n-substrate 4. A P+ diffusion 2 in p-well 3 provides a connection to the line to be protected on the surface of the device. The junction depth of p-well 3 provides a suitable resistance value for resistor Rw1.

The Lower SCR Circuit Structure

The structure of the lower SCR circuit will be readily understood. Transistor Q3 is a lateral PNP transistor having its collector formed by p-well 5, its emitter formed by p-well 3, and its base formed by the intervening substrate 4. A P+ diffusion 2 in p-well 3 is connected to the protected line, and the resistance of p-well 3 between diffusion 2 and the base-emitter junction establishes resistor Rw1, which connects the emitter terminal of Q3 to the protected line. Note that resistance Rw1 is also shown in the upper circuit of FIG. 1; D2 in the upper circuit, the junction of p-well 3 and n-substrate 4, is also connected to the protected line through the resistance of p-well 3.

When an excessive positive voltage appears on the protected line, its circuit path to ground can be traced through the following structures: Vin, P+ diffusion 2, p-well 3 (resistor Rw1 and the emitter of Q3), n-substrate 4 (the base of Q3), p-well 5 (the collector of Q3 and resistor Rw2), N+ diffusion 6 and ground terminal.

The n-substrate 4 forms the collector of vertical NPN transistor Q4 and p-well 5 forms its base, as in the structure for vertical transistor Q2. The emitter is formed by an N+ diffusion 6. Thus Q2 and Q4 can be considered to be a single bipolar transistor with two emitters. Note that the junction of N+ diffusion 9 and p-well 5 also forms diode D1.

The field oxide PMOS is has a drain formed by p-well 5, a source formed by a p-well 3, a field oxide 8, and a gate electrode. The gate electrode is connected to GND. The turn-on voltage (between gate and source) of a PMOS of this construction is about negative 30–50 volts.

Other Embodiments

The device of FIG. 2 can be implemented in an equivalent structure having a p-substrate, n-wells where the device of FIG. 2 has p-wells, and other changes in conductivity type and polarity. Those skilled in the art will recognize other variations in the description, within the skill of the art and the intended scope of the claims.

We claim:

1. A circuit for protection of a conductive line on a CMOS device from an excessive voltage, comprising,
   two SCR circuits, each connected to conduct between an associated power supply point and the line to be protected, each operable to turn on in response to a voltage between its associated power supply point and the line to be protected, whereby the power supply points provide voltage references for turning on the SCR's and form sinks for the currents associated with excessive voltages when an SCR turns on,
   wherein an improved semiconductor structure comprises,
   a substrate of a predetermined conductivity (n-substrate 4),
   a first (10), second (5) and third (3) well of the opposite conductivity type (p-well) formed in the substrate,
   a first parasitic bipolar junction transistor (Q1) having its collector formed by the second well (5) and its base formed by the adjacent substrate (4) and its emitter formed by the first well (10),
   a second parasitic bipolar junction transistor (Q2) having its base formed by the second well (5), which forms the collector of the first transistor, its emitter (9) formed in the well of its base, and its collector formed by the underlying substrate (4), which forms the base of the first transistor,
   whereby the base and collector of the first and second transistors are formed in common regions (4, 5) interconnecting the transistors to form an SCR,
   means (10, 11) connecting the emitter of the first transistor to its associated power supply terminal and means connecting the emitter of the second transistor to the line to be protected,
   a third parasitic bipolar junction transistor (Q3) having its collector formed by the second well (5), its base formed by the adjacent substrate (4), and its emitter formed by the third well (3),
   a fourth parasitic bipolar junction transistor (Q4) having its base formed by the second well (5), which forms the collector of the lateral transistor, its emitter (6) formed in the well of its base, and its collector formed by the underlying substrate (4), which forms the base of the third bipolar transistor,
   whereby the base and collector of the third and fourth transistors are formed in a shared regions (4, 5) interconnecting the transistors to form an SCR, and
   means (2, 3) connecting the emitter terminal (3) of the third transistor to the line to be protected and means connecting the emitter terminal of the fourth transistor to the associated power supply terminal.

2. The protection circuit of claim 1 wherein the wells for the SCR circuits are formed by the same process as wells for CMOS circuits on the device.

3. The protection circuit of claim 2 wherein
   the second well is located between the first and third wells and,
   the second well and the second and fourth transistors are vertical transistors having their base and collector region formed by the second well and the underlying substrate,
   and the first and third transistors are lateral transistors having their collectors formed by the second well, their emitters formed by the first and third wells, and their bases formed by the intervening region of the substrate.

4. The protection circuit of claim 3 wherein the second and fourth transistors are formed as a single vertical transistor having two emitters.

5. The protection circuit of claim 3 wherein each SCR circuit has an FET having its source and drain terminals connected to turn on the associated SCR and having its source and gate terminals conduct to respond to predetermined voltage between the line and the associated power supply terminal.

6. The protection circuit of claim 3 wherein each SCR circuit has a diode connected to conduct in its reverse direction in response to a predetermined excessive voltage between the line and the associated power supply terminal and to provide a current for turning on the SCR.

7. The protection circuit of claim 6 wherein the SCR circuit of the first and second transistors is arbitrarily designated the upper circuit and the SCR circuit of the third and fourth transistors is arbitrarily designated the lower circuit, and wherein the lower circuit includes a first diode (D1) connected to conduct in its reverse direction in response to a predetermined voltage between the line to be protected and the common connection point of the collector of said third transistor and the base of said forth transistor for turning on the lower SCR circuit.

8. The protection circuit of claim 7 wherein said first diode is formed by the regions (5, 9) forming the base and emitter of said second transistor.

9. The protection circuit of claim 8 wherein the upper SCR circuit includes a resistor (Rw1) and a second diode (D2) connected to conduct in the reverse direction of the diode in response to a predetermined voltage between the line to be protected and the common connection point of the collector of said second transistor and the base of said first transistor for turning on the upper SCR circuit in response to the predetermined voltage.

10. The protection circuit of claim 9 wherein said second diode is formed by the regions (3, 4) forming the base and emitter of said third transistor.

11. The protection circuit of claim 10 wherein said resistor (Rw1) is formed by the vertical path through said third well.

12. The protection circuit of claim 8 wherein the FET in the upper circuit has its channel formed in the second well (5), a field-oxide forming its gate insulation, a gate electrode connected to the associated power supply point ($V_{DD}$), its drain formed in the adjacent substrate (4), which forms the collector of the second transistor and the base of the first transistor, and its source formed by the region (9) forming the emitter of the second transistor, whereby the FET turns on the lower SCR in response to a predetermined voltage of the polarity opposite to the polarity of the associated power supply.

13. The protection circuit of claim 12 wherein the FET in the lower circuit has its drain formed in the second well (5), its source formed in the third well (3), and its channel formed in the adjacent substrate (4), a field-oxide forming its gate insulation, a gate electrode connected to the associated power supply point (ground), which forms the collector of the second transistor and the base of the first transistor, and its source formed by the region (9) forming the emitter of the second transistor, whereby the FET turns on the upper SCR in response to a predetermined voltage of the polarity opposite to the polarity of the associated power supply.

14. The protection circuit of claim 13 wherein the substrate is an n-substrate and the wells are p-wells.

15. The protection circuit of claim 14 wherein the first and third transistors are PNP transistors and the second and fourth transistors are NPN transistors.

16. A protection circuit comprising two protection circuits as defined in claim 13 arranged symmetrically with respect to the line to be protected.

17. The protection circuit of claim 16 wherein the third well is shared by the two symmetrical circuits.

* * * * *